United States Patent
Foube

(10) Patent No.: US 11,095,205 B2
(45) Date of Patent: Aug. 17, 2021

(54) METHOD AND DEVICE FOR ON-LINE MONITORING DC-BUS CAPACITOR

(71) Applicant: MITSUBISHI ELECTRIC CORPORATION, Tokyo (JP)

(72) Inventor: Laurent Foube, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 37 days.

(21) Appl. No.: 16/639,968

(22) PCT Filed: Sep. 5, 2018

(86) PCT No.: PCT/JP2018/033723
§ 371 (c)(1),
(2) Date: Feb. 18, 2020

(87) PCT Pub. No.: WO2019/082535
PCT Pub. Date: May 2, 2019

(65) Prior Publication Data
US 2020/0251982 A1    Aug. 6, 2020

(30) Foreign Application Priority Data

Oct. 24, 2017   (EP) ..................................... 17198150

(51) Int. Cl.
*H02M 1/32* (2007.01)
*G01R 27/26* (2006.01)
(Continued)

(52) U.S. Cl.
CPC .......... *H02M 1/32* (2013.01); *G01R 27/2605* (2013.01); *G01R 31/64* (2020.01); *H02M 5/458* (2013.01); *H02M 1/0009* (2021.05)

(58) Field of Classification Search
CPC .... H02M 1/00; H02M 1/0009; H02M 1/0083; H02M 1/009; H02M 1/32; H02M 1/327;
(Continued)

(56) References Cited

U.S. PATENT DOCUMENTS 7,053,569 B2 * 5/2006 Takahashi ......... H02M 7/53873
                                                      318/400.27
8,069,000 B2 * 11/2011 Kim .................... G05B 23/0283
                                                      702/63
(Continued)

FOREIGN PATENT DOCUMENTS

CN        105717368 A       6/2016
EP        1 347 567 A1      9/2003
(Continued)

*Primary Examiner* — Hoai-An D. Nguyen
(74) *Attorney, Agent, or Firm* — Birch, Stewart, Kolasch & Birch, LLP.

(57) ABSTRACT

The method:
determines, within the switching cycle, when current is not provided to the DC-bus capacitor,
determines, for each switching cycle, the sector of a reference vector, active vectors durations and null voltage vectors durations,
determines from the determined durations, sampling instants,
samples the currents through the three phases and the DC-bus voltage at the determined sampling instants,
determines, from the phase currents sampled at the determined sampling instants, the current flowing through the DC-bus capacitor during the active vectors,
estimates the capacitance value and/or the equivalent series resistance value of the DC-bus capacitor,
compares the capacitance value and/or the equivalent series resistance value to a threshold and determines if the DC-bus capacitor reaches its end of life according to the comparison result.

10 Claims, 6 Drawing Sheets

(51) Int. Cl.
*G01R 31/64* (2020.01)
*H02M 5/458* (2006.01)
*H02M 1/00* (2006.01)

(58) Field of Classification Search
CPC ............ H02M 5/00; H02M 5/40; H02M 5/42;
H02M 5/44; H02M 5/453; H02M 5/458;
H02M 7/00; H02M 7/42; H02M 7/44;
H02M 7/48; H02M 7/53; H02M 7/537;
H02M 7/539; H02M 7/5395; H02P 27/00;
H02P 27/04; H02P 27/06; H02P 27/08;
H02P 29/00; H02P 29/60; H02P 29/68;
G01R 27/00; G01R 27/02; G01R 27/26;
G01R 27/2605; G01R 31/00; G01R
31/40; G01R 31/50; G01R 31/64
USPC ...................... 324/76.11, 107, 500, 537, 548
See application file for complete search history.

(56) References Cited

U.S. PATENT DOCUMENTS

| | | | | |
|---|---|---|---|---|
| 9,739,735 | B2* | 8/2017 | Mollov | G01N 27/14 |
| 10,389,291 | B2* | 8/2019 | Kato | H02P 27/06 |
| 10,564,210 | B2* | 2/2020 | Yoshida | G01R 31/64 |
| 2003/0173946 | A1 | 9/2003 | Liu et al. | |
| 2004/0232863 | A1* | 11/2004 | Takahashi | H02P 23/26 |
| | | | | 318/432 |
| 2013/0155729 | A1 | 6/2013 | Lee | |
| 2014/0029308 | A1* | 1/2014 | Cojocaru | H01G 9/28 |
| | | | | 363/13 |
| 2016/0266189 | A1* | 9/2016 | Yoshida | G01R 31/64 |
| 2016/0377565 | A1* | 12/2016 | Mollov | G01R 31/64 |
| | | | | 324/441 |
| 2017/0219441 | A1 | 8/2017 | Doppelhammer et al. | |
| 2020/0091747 | A1* | 3/2020 | Merkl | G05B 19/0428 |

FOREIGN PATENT DOCUMENTS

| | | |
|---|---|---|
| EP | 3 199 929 A1 | 8/2017 |
| KR | 10-2017-0014070 A | 2/2017 |

* cited by examiner

| Sector | $I_{avg1}$ | $I_{avg2}$ |
|---|---|---|
| 1 | $Is1\_C$ | $Is1\_D+Is2\_D$ |
| 2 | $Is2\_C$ | $Is1\_D+Is2\_D$ |
| 3 | $Is2\_C$ | $Is2\_D+Is3\_D$ |
| 4 | $Is3\_C$ | $Is2\_D+Is3\_D$ |
| 5 | $Is3\_C$ | $Is1\_D+Is3\_D$ |
| 6 | $Is1\_C$ | $Is1\_D+Is3\_D$ |

FIG. 7

METHOD AND DEVICE FOR ON-LINE MONITORING DC-BUS CAPACITOR

TECHNICAL FIELD

The present invention relates generally to a method and device for on-line monitoring of a DC-bus capacitor that is included in a three-phase inverter having a diode rectifier front end.

BACKGROUND ART

In the field of Power Electronics, DC-bus capacitors are known as vulnerable components especially because usually electrolytic capacitors are used for that function. Their failure leads to out-of-service condition for the entire converter.

DC-bus capacitors are often the most limiting factor for long-life products. This is the reason why we observe an increased interest in Condition Monitoring technologies, that permit timely replacement of these components, while disturbance on the service rendered by the equipment is minimised.

Solutions have been proposed to detect ageing of DC-bus capacitors. Usually the ageing detection is made by monitoring the variation of some parameters of the DC-bus capacitor. For example, a reduction of the DC-bus capacitance value may be used to detect the end of life of the DC-bus capacitor, an increase of the equivalent series resistance (ESR) may be used to detect the end of life of the DC-bus capacitor or an increase of the loss factor may be used to detect the end of life of the DC-bus capacitor. The estimation of the parameters may be made by using measurements of the capacitor's voltage and current.

Non-intrusive capacitor ageing detection methods are usually not accurate enough and require special mode of operation to be applicable like for example regenerative operation.

SUMMARY OF INVENTION

A first factor that influences the accuracy of ageing detection is the definition of ageing limits. The ageing limit is usually either a fixed value at a given temperature, or a set of values for different temperatures derived either by initial pre-characterization of the type of capacitor monitored or from datasheet information. Data sheet information is not accurate enough for the particular capacitor(s) monitored due to relatively large manufacturer tolerance. In addition, the estimation of ageing has its own accuracy, which constitutes an additional limiting factor for an accurate ageing detection.

The present invention aims at providing a non-intrusive DC-bus capacitor condition monitoring system that is included in a three-phase inverter having a diode rectifier front end which is low cost, resilient to disturbances, has repeatable performance and does not need a special mode of operation of the three-phase inverter.

The present invention also aims at providing an on-line monitoring of an DC-bus capacitor condition using an accurate ESR and/or capacitance value estimation method that operates during normal operation of a three-phase inverter having a diode rectifier front end using a self-calibration method to define precisely the ageing limits, during early operating time of DC-bus capacitor.

To that end, the present invention concerns a method for on-line monitoring a DC-bus capacitor comprised in a three-phase inverter having a diode rectifier front end, the three-phase inverter controlling the three-phase power provided to a load at each switching cycle using a space vector modulation, characterized in that the method comprises the steps of:

determining, within the switching cycle, when current is not provided to the DC-bus capacitor, determining, for each switching cycle, the sector of a reference vector, active vectors durations and null voltage vectors durations, determining from the determined durations, sampling instants, sampling the currents through the three phases and the DC-bus voltage at the determined sampling instants, determining, from the phase currents sampled at the determined sampling instants, the current flowing through the DC-bus capacitor during the active vectors, estimating the capacitance value and/or the equivalent series resistance value of the DC-bus capacitor, comparing the capacitance value and/or the equivalent series resistance value to a threshold and determining if the DC-bus capacitor reaches its end of life according to the comparison result.

The present invention concerns also a device for on-line monitoring a DC-bus capacitor comprised in a three-phase inverter having a diode rectifier front end, the three-phase inverter controlling the three-phase power provided to a load at each switching cycle using a space vector modulation, characterized in that the device comprises:

means for determining, within the switching cycle, when current is not provided to the DC-bus capacitor, means for determining, for each switching cycle, the sector of a reference vector, the active vectors durations and the null voltage vectors durations, means for determining from the determined durations, sampling instants, means for sampling the currents through the three-phases and the DC-bus voltage at the determined sampling instants, means for determining from the phase currents sampled at the determined sampling instants the current flowing through the DC-bus capacitor during the active vectors, means for estimating the capacitance value and/or the equivalent series resistance value of the DC-bus capacitor, means for comparing the capacitance value and/or the equivalent series resistance value to a threshold and determining if the DC-bus capacitor reaches its end of life according to the comparison result.

Thus, the present invention enables an on-line monitoring of a DC-bus capacitor condition using an accurate ESR and/or capacitor value estimation method that operates during normal operation of a three-phase inverter having a diode rectifier front end.

Thanks to the present invention, it is not necessary to inject any disturbance to allow estimation of the capacitance value or the ESR value of the DC-bus capacitor, since the naturally present voltage and current ripple is used by the present invention. The current going through the DC-bus capacitor is accurately calculated thanks to the specific sampling scheme used by the present invention.

According to a particular feature, each switching cycle is divided into a first half switching cycle and a second half switching cycle and the sampling, the estimating and comparing steps are executed at each half switching cycle.

Thus, the present invention enables performing estimation of DC-bus capacitor's parameters often. The large number of evaluations offers the possibility of filtering the results for better accuracy.

According to a particular feature, sampling instants are determined, as in the middle of the durations of the active vectors, as the beginning of half switching cycles.

Thus, the sampling instants selected allow an acquisition of DC-bus voltage and phase currents outside the transient phases as each switching is followed by transients during a given period, for example due to combinations of parasitic inductances and capacitances. Moreover, the sampling of phase currents in the middle of active vectors allows to determine accurately the average current within each active vector that flows through monitored capacitor, when no current flows from rectifier. The calculation of capacitor current avoids the use of a dedicated current sensor in series with the DC-bus capacitor, which can be either costly or not convenient, and takes benefit of available sensors of phase currents.

According to a particular feature, the determining when current is not provided to the DC-bus capacitor is performed using a current sensor located at an output of the front end rectifier or by detecting a voltage drop of the DC-bus voltage.

Thus, it is not required to operate in regenerative mode, i.e. during deceleration of motor, to ensure that no current is delivered by rectifier to DC-bus capacitor. This also enables more frequent evaluation of capacitor's parameters, like ESR or capacitance value, since current is regularly interrupted in the case of a front-end rectifier.

According to a particular feature, the threshold is determined during a calibration period.

Thus, the present invention allows to determine an accurate threshold, i.e. an ageing limit, based on the state of the capacitor in its healthy state. Most of the uncertainties are removed by the calibration procedure as this one is implemented in situ, by self-calibration, i.e. by measuring ESR and C.

According to a particular feature, the threshold is selected among a plurality of thresholds using an obtained temperature of the DC-bus capacitor.

Thus, the present invention allows the state of health estimation of DC-bus capacitor at different temperatures. It is indeed required to define ageing limits at different temperatures since parameters estimated are quite variable with temperature.

The characteristics of the invention will emerge more clearly from a reading of the following description of example embodiments, the said description being produced with reference to the accompanying drawings.

BRIEF DESCRIPTION OF DRAWINGS

FIG. 7 represents an example of calculation of the DC-bus capacitor current during the active vectors depending on the sector in which the reference vector is located.

DESCRIPTION OF EMBODIMENTS

Figure 1:
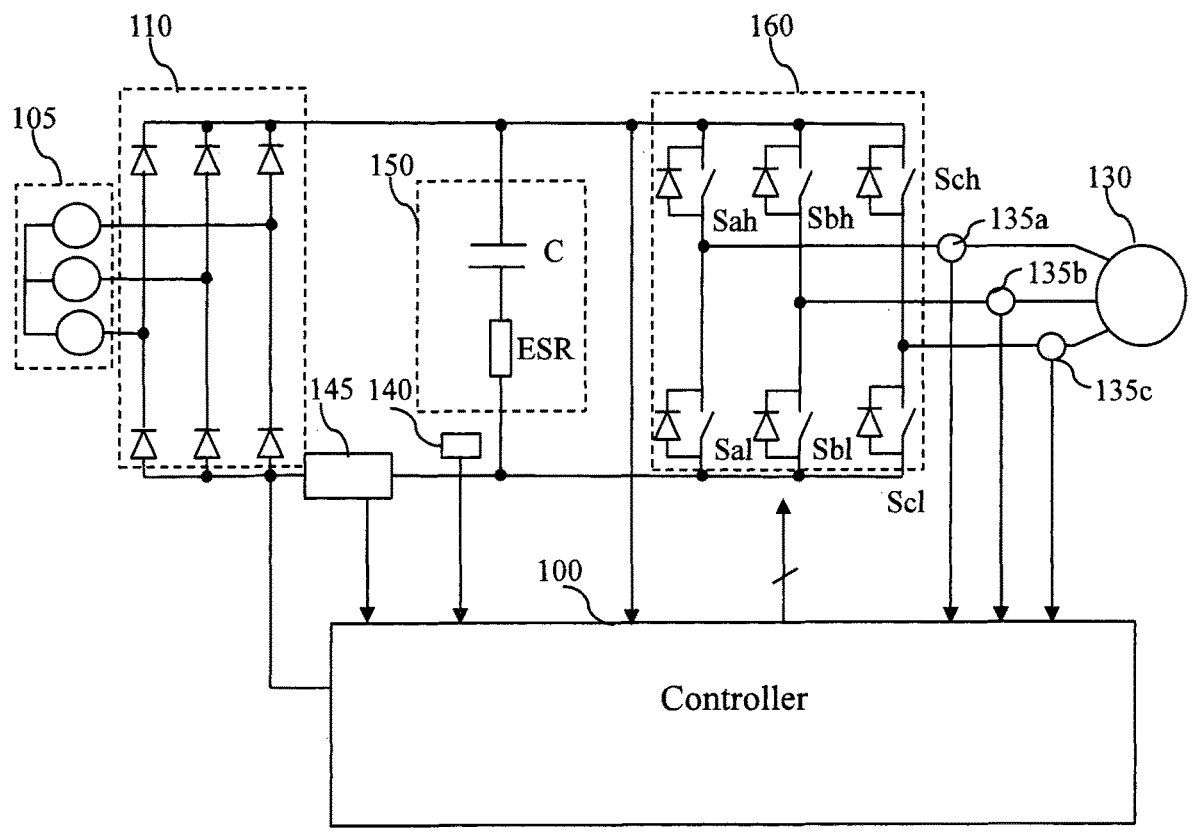
FIG. 1 represents an example of an architecture of a DC-bus capacitor condition monitoring system that is included in a three-phase inverter having a diode rectifier front end.

FIG. 1 represents an example of an architecture of a DC-bus capacitor condition monitoring system that is included in a three-phase inverter having a diode rectifier front end according to the present invention.

The power converter is mainly composed of a three-phase inverter 160, a DC-bus capacitor 150, a diode front end rectifier 110 and a processing unit 100.

The DC-bus capacitor 150 may be composed of plural capacitors, thus forming a capacitor bank.

The power converter receives three-phase alternative electric power 105 and drives a load 130 that is, for example, a three-phase motor.

Each phase of the load 130 comprises one current sensor noted 135a, 135b and 135c. In a variant, only two phases of the load 130 comprise one current sensor, the current of the other phase of the load being determined from the values provided by the two current sensors.

The power converter comprises a temperature sensor 140 that senses the temperature of the DC-bus capacitor 150.

The DC-bus capacitor 150 is for example a single DC-bus capacitor or a capacitor bank.

The power converter comprises a current detector 145 that senses if the DC-bus capacitor 150 is discharging, i.e. when the front end rectifier 110 does not deliver current to the DC-bus capacitor 150. It has to be noted here that the current detector may be implemented in software by an analysis of the DC-bus voltage.

Figure 4:
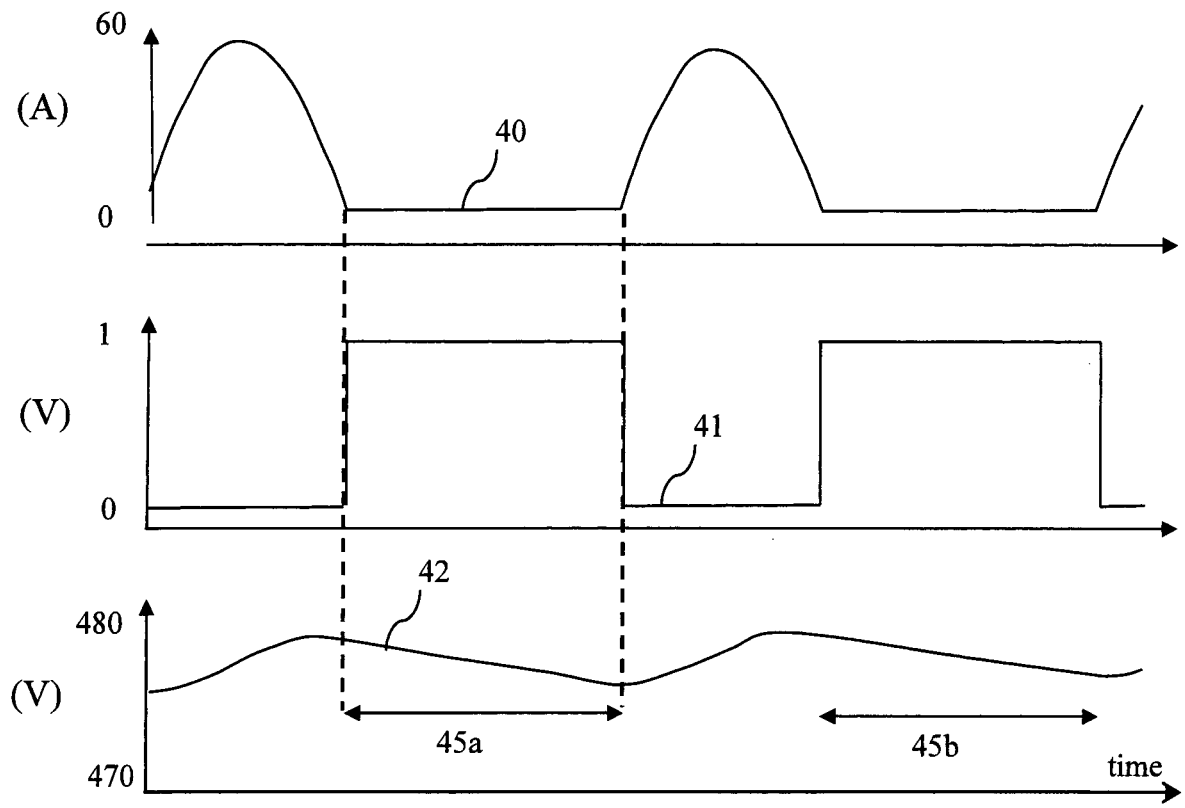
FIG. 4 represents signals of the three-phase inverter having a diode rectifier front end that used for determining when the condition of a DC-bus capacitor has to be monitored.

Example of such DC-bus capacitor discharge is given in FIG. 4.

According to the invention, the capacitance value C and/or the equivalent series resistor values ESR are monitored.

The processing unit 100 controls the switches of the three-phase inverter 160 using space vector modulation as pulse width modulation method and monitors the condition of the DC-bus capacitor 150. The three-phase inverter 160 converts a DC-bus voltage into three alternating output voltages, via a series of switches Sah, Sal, Sbh, Sbl, Sch and Scl, forming three output legs which are connected to the three-phase load 130.

According to the invention:
it is determined a reference vector, active vectors durations and null voltage vectors durations,
it is determined from the determined durations, sampling instants,
the currents through the three phases are sampled at the determined sampling instants,
the current through the capacitor is calculated from the phase currents sampled at the determined sampling instants, the capacitance value and/or the equivalent series resistance value of the DC-bus capacitor is estimated, the capacitance value and/or the equivalent series resistance value is compared to a threshold and it is determined if the DC-bus capacitor reaches its end of life according to the comparison result.

Figure 2:
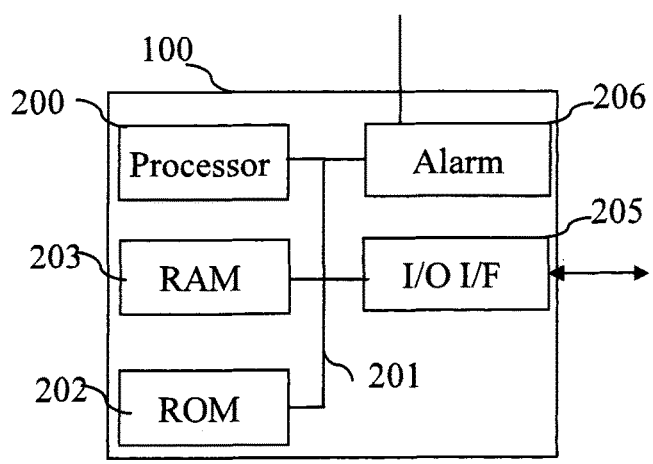
FIG. 2 represents the architecture of a processing unit of the DC-bus capacitor condition monitoring system.

FIG. 2 represents the architecture of a processing unit of the DC-bus capacitor condition monitoring system according to the present invention.

Figure 3:
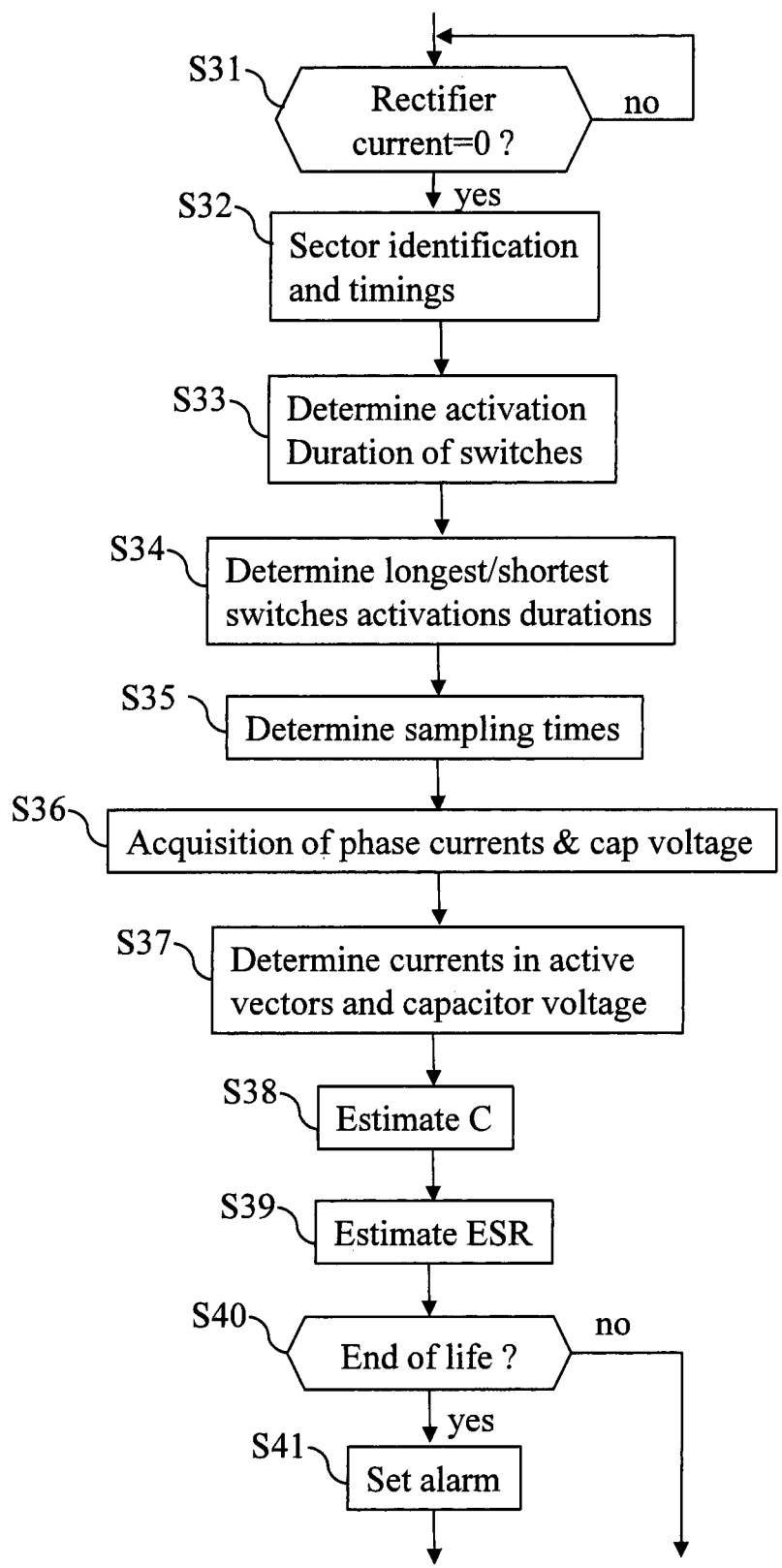
FIG. 3 represents an example of an algorithm for monitoring the condition of a DC-bus capacitor of a three-phase inverter having a diode rectifier front end.

The processing unit 100 has, for example, an architecture based on components connected together by a bus 201 and a processor 200 controlled by a program as disclosed in FIG. 3.

The bus 201 links the processor 200 to a read only memory ROM 202, a random access memory RAM 203, an input output interface I/O IF 205 and an alarm interface 206. The memory 203 contains registers intended to receive variables and the instructions of the program related to the algorithm as disclosed in FIG. 3.

The processor 200 receives through the input output I/O IF 205 sensed temperature 140, current values sensed by the sensors 135a, 135b, 135c, the DC-bus capacitor voltage and transfers command signals to the three-phase inverter 160. The input output I/O IF includes an analogue to digital converter. Some analog signal conditioning is also of course included like a scaling of high DC-bus voltage, low pass filtering like for example anti-aliasing filters in order to acquire the different signals like for example the DC-bus voltage, output phase currents.

The processor 200, upon detection of the end of life of the DC-bus capacitor 150 commands the alarm module 206 which is for example a LED or an alarm signal that notifies a maintenance request.

The read-only memory, or possibly a Flash memory 202, contains instructions of the programs related to the algorithm as disclosed in FIG. 3, when the processing unit 100 is powered on, are loaded to the random access memory 203. Alternatively, the program may also be executed directly from the ROM 202.

The processing unit 100 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the processing unit 100 includes circuitry, or a device including circuitry, causing the processing unit 100 to perform the program related to the algorithm as disclosed in FIG. 3.

FIG. 3 represents an example of an algorithm for monitoring the condition of a DC-bus capacitor of a three-phase inverter having a diode rectifier front end according to the present invention.

The present algorithm is disclosed in an example wherein it is executed by the processor 200 of the processing unit 100.

At step S31, the processor 200 detects if the DC-bus capacitor voltage is decreasing, i.e. when the front end rectifier 110 does not deliver current to DC-bus capacitor 150.

For example, the processor 200 checks if the current sensed by the current detector 145 is below a predetermined value.

The current detector 145 is for example composed of a low value resistor inserted between rectifier and DC-bus negative poles, for example equal to 1 mΩ and a comparator that compares the voltage drop across the resistor to a threshold value.

Example of DC-bus capacitor voltage variation is given in FIG. 4.

FIG. 4 represents signals of the three-phase inverter having a diode rectifier front end that are used for determining when the condition of a DC-bus capacitor has to be monitored.

The curve noted 40 represents the diode rectifier output current.

The horizontal axis represents the time and the vertical axis represents the current value expressed in Ampere.

The curve noted 41 represents the boolean signal at the output of the current detector 145.

The horizontal axis represents the time and the vertical axis represents the logical state 0 or 1.

The curve noted 42 represents the DC-bus voltage signal. The time durations noted 45a and 45b are the periods where the current sensed by the current detector 145 is below a predetermined value, i.e. when the front end rectifier 110 does not deliver current to DC-bus capacitor 150. During these time periods, the diode rectifier does not conduct and it is possible to calculate the DC-bus capacitor current.

If the front end rectifier 110 does not deliver current to DC-bus capacitor 150, the processor 200 moves to step S32. Otherwise, the processor 200 reiterates the step S31.

The present invention method uses the ripple naturally present in the power converter for estimation of parameter without the need to create any additional disturbances. To enable calculation of capacitor current, the operation here is performed during discharge phases of DC-bus that naturally occur regularly with a diode front-end rectifier, when this later does not conduct, i.e. each time input voltage is insufficient to provide current to the DC-bus. There is no need to operate during regenerative operation, i.e. when the DC-bus voltage is increased so as to prevent conduction of input rectifier, which is not always possible anyway. This allows to calculate capacitor current very frequently. Regenerative operation means that the load 130 delivers current to the DC-bus, whose voltage increases thus blocking the conduction of the diode rectifier. This is another way to ensure that the current in the DC-bus capacitor can be calculated accurately with the only knowledge of inverter current, i.e. the current that flows from DC-bus to the inverter 160.

At step S32, the processor 200 determines the sector of a reference vector synthesized by the space vector modulation. The reference vector is determined by the standard control part of the inverter that results for instance of control loops such as speed and rotor flux of motor. In the context of this invention, the processor 200 needs to get information already determined by standard control of the power inverter performed at every switching interval.

An "active vector" corresponds to a configuration of switches leading to power exchange between DC-bus and the load 130.

Alternatively, during a "0-voltage vector" the three-phase inverter 160 has no effect on current within DC-bus capacitor, 0-voltage vector corresponds to all upper switches Sah, Sbh and Sch which are either on or off.

Since the three-phase power inverter has three legs, eight different vectors can be defined, of which six correspond to active vectors and two correspond to 0-voltage vectors.

Figure 5:
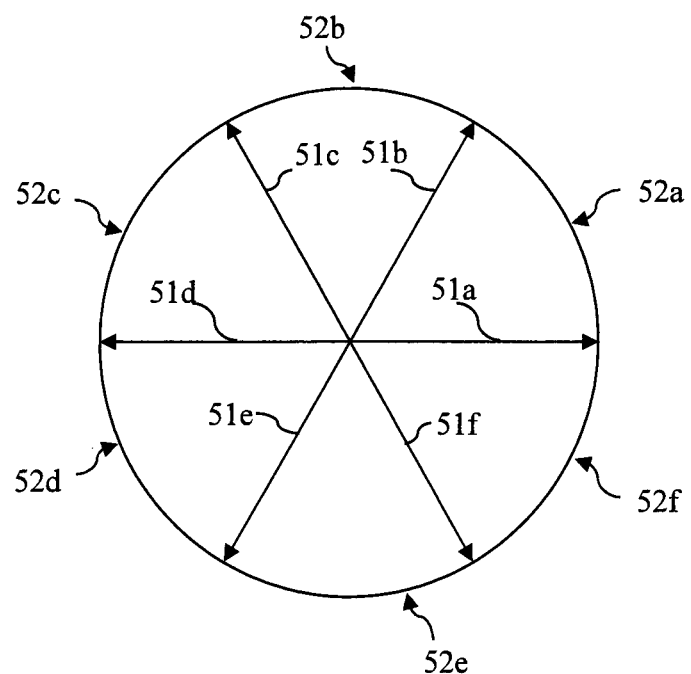
FIG. 5 represents an example of vectors and sectors of a space vector modulation used as a pulse width modulation method of the three-phase inverter.

Example of vectors and sectors is given in reference to FIG. 5.

FIG. 5 represents an example of vectors and sectors of a space vector modulation used as a pulse width modulation method of the three-phase inverter.

In FIG. 5, active vectors are denoted 51a to 51f and sectors are denoted 52a to 52f. The sector denoted 52a to 52f can also be denoted as sector 1 to sector 6.

Space vector modulation (SVM) is an algorithm for the control of pulse width modulation (PWM). This method is commonly used for motor drive applications, to control the variable speed of a three-phase AC powered motor. The basic idea of the method is the synthesis of a rotating reference vector in the referential defined in FIG. 5. During its rotation, the reference vector successively traverses the six sectors 52a to 52f. The three-phase power inverter generates a complete low frequency electric period of each output phase voltage for each full rotation of the reference vector. A new reference vector is calculated every switching interval, typically at several kHz. The angle between two successive vectors depends on the ratio between the switching frequency and the electrical period of output voltage. Null vectors (not represented) would be located in the center of the circle. They are used in combination with active vectors to control the amplitude of the rotating vector. When the reference vector is located in a particular sector, it is synthesised by using a time linear combination of the two adjacent active vectors that limit the sector, and by a combination of null vectors: the average voltages delivered by the three-phase power inverter during a switching interval thus directly result from the time average of the application of fixed voltages applied for some durations during this switching period.

Figure 6A:
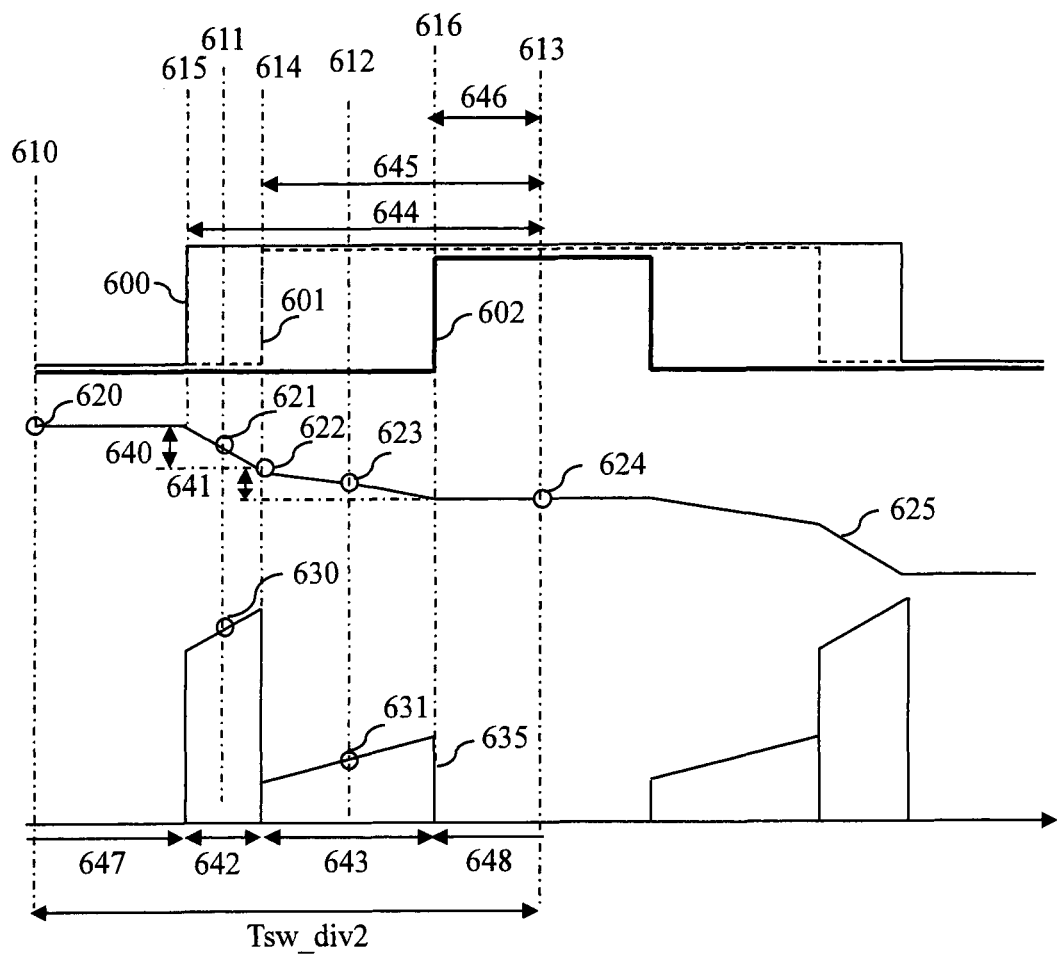
FIG. 6A is an example of signals and parameters used for determining DC-bus capacitor condition during a first half of a switching cycle of the three-phase inverter having a diode rectifier front end.
Figure 6B:
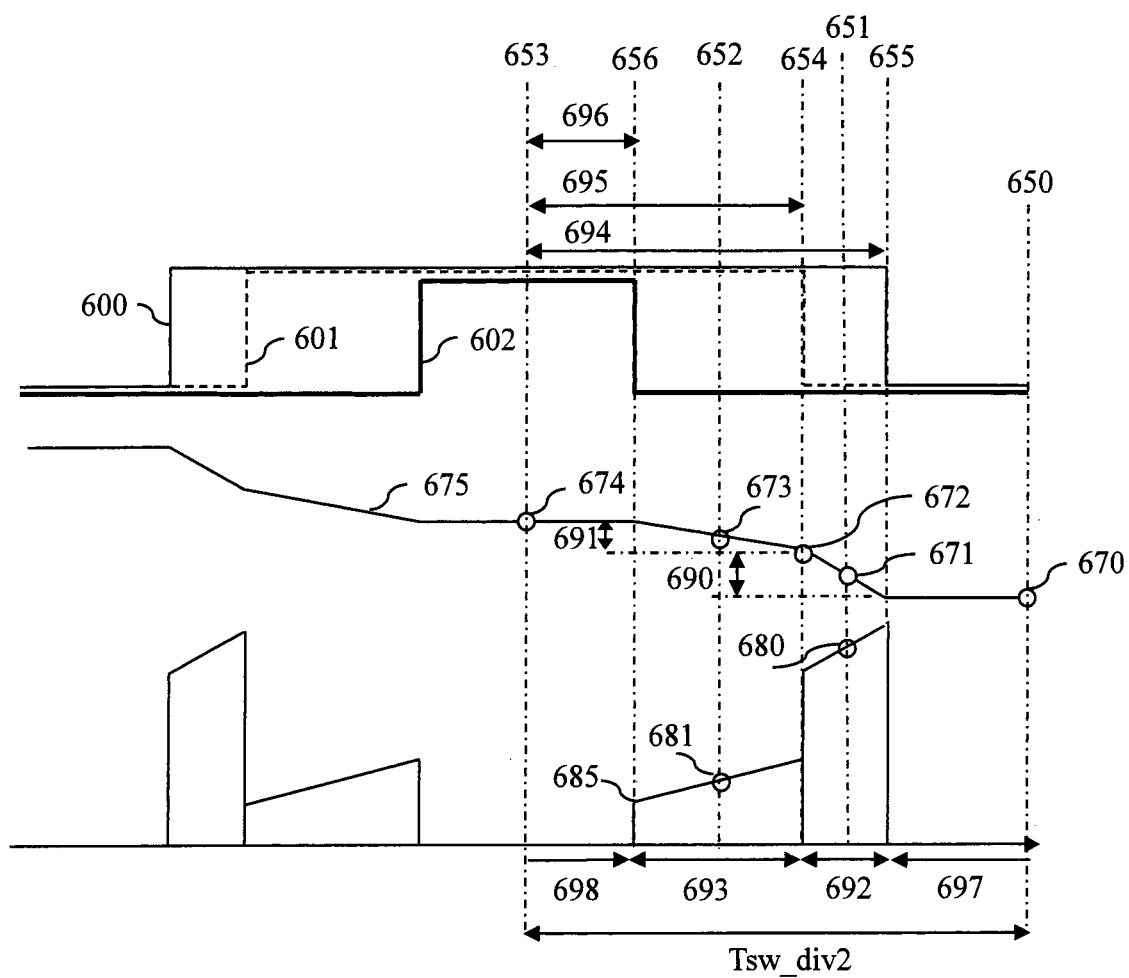
FIG. 6B is an example of signals and parameters used for determining DC-bus capacitor condition during a second half of a switching cycle of the three-phase inverter having a diode rectifier front end.

Each synthesis of the reference vector leads thus to the generation of a particular PWM pattern for the three-legs of inverter such as described on FIGS. 6A and 6B. Duration of activation of the different gate signals directly results from the synthesis process of the voltage reference vector.

At step S33, the processor 200 determines the active vectors and the 0-voltage vectors durations.

FIG. 6A is an example of signals and parameters used for determining DC-bus capacitor condition during a first half of a switching cycle of the three-phase inverter having a diode rectifier front end according to the present invention.

In FIG. 6A, the curve noted 600 represents the signal applied to the switch Sah. The high level corresponds to the conduction state of the switch Sah. It has to be noted here that the signal applied to the switch Sal is the complement of the signal applied to the switch Sah considering that deadtime between switching is negligeable.

The curve noted 601 represents the signal applied to the switch Sbh. The high level corresponds to the conduction state of the switch Sbh. It has to be noted here that the signal applied to the switch Sbl is the complement of the signal applied to the switch Sbh considering that deadtime between switching is negligeable.

The curve noted 602 represents the signal applied to the switch Sch. The high level corresponds to the conduction state of the switch Sch. It has to be noted here that the signal applied to the switch Scl is the complement of the signal applied to the switch Sch considering that deadtime between switching is negligeable.

The processor 200 determines the active duration tga noted 644 of the conduction state of the switch Sah of the three-phase inverter 160.

The processor 200 determines the active duration tgb noted 645 of the conduction state of the switch Sbh of the three-phase inverter 160.

The processor 200 determines the duration tgc noted 646 of the conduction state of the switch Sch of the three-phase inverter 160.

From tga, tgb and tgc, the processor 200 determines the duration 647 that corresponds to a duration of a first 0 voltage vector, the duration ΔT1 noted 642 that corresponds to the duration of a first active vector, the duration ΔT2 noted 643 that corresponds to the duration of a second active vector and the duration 648 that corresponds to a duration of a second 0 voltage vector.

At step S34, the processor 200 determines among the durations tga, tgb and tgc, the longest duration tMax and the shortest duration tMin. The intermediate duration is noted tMid. On the example illustrated on FIG. 6A, tMax is thus the duration noted 644 while tMin is the duration noted 646 and finally tMid is the duration noted 645.

FIG. 6B is an example of signals and parameters used for determining DC-bus capacitor condition during a second half of a switching cycle of the three-phase inverter having a diode rectifier front end according to the present invention.

In FIG. 6B, the curve noted 600 represents the signal applied to the switch Sah. The high level corresponds to the conduction state of the switch Sah. It has to be noted here that the signal applied to the switch Sal is the complement of the signal applied to the switch Sah considering that deadtime between switching is negligeable.

The curve noted 601 represents the signal applied to the switch Sbh. The high level corresponds to the conduction state of the switch Sbh. It has to be noted here that the signal applied to the switch Sbl is the complement of the signal applied to the switch Sbh considering that deadtime between switching is negligeable.

The curve noted 602 represents the signal applied to the switch Sch. The high level corresponds to the conduction state of the switch Sch. It has to be noted here that the signal applied to the switch Scl is the complement of the signal applied to the switch Sch considering that deadtime between switching is negligeable.

The duration tga noted 694 is the duration of the conduction state of the switch Sah of the three-phase inverter 160, the duration tgb noted 695 is the duration of the conduction state of the switch Sbh of the three-phase inverter 160 and the duration tgc noted 696 is the duration of the conduction state of the switch Sch of the three-phase inverter 160.

The duration ΔT2 noted 693 corresponds to the duration of the second active vector, the duration ΔT1 noted 692 corresponds to the duration of the first active vector, the duration 697 corresponds to a duration of a first 0 voltage vector and the duration 698 corresponds to a duration of a second 0 voltage vector.

At step S34, the processor 200 determines among the durations tga, tgb and tgc, the longest duration tMax and the shortest duration tMin. The intermediate duration is noted tMid. On example illustrated on FIG. 6B, tMax is thus the duration noted 694 while tMin is the duration noted 696 and finally tMid is the duration noted 695.

At step S35, the processor 200 determines sampling instants of the voltage of the DC-bus capacitor 150 and sampling instants of currents sensed by the current sensors 135a, 135b and 135c.

Referring to FIG. 6A, sampling instants 611 and 612 are determined as in the middle of the durations of the applied vectors. Sampling instants (relative to beginning of switching cycle noted 610) can be determined by simple arithmetic, for example as:

sampling instant 611=Tsw_div2−tMax+(tMax−tMid)/ 2;

sampling instant 612=Tsw_div2−tMid+(tMid−tMin)/ 2;

where Tsw_div2 is the duration of a half switching cycle.

Sampling instant 610 is determined as the beginning of first half switching cycle.

Sampling instant 613 is determined as the beginning of second switching interval (middle of switching interval).

It has to be noted that sampling instants 610 and 613 correspond to sampling during the 0-voltage vectors, which are the "normal" sampling positions for standard control of the inverter.

Instant 614 is determined as the frontier between the first and second active vectors.

Referring to FIG. 6B, sampling instant 653 is determined as the beginning of the second half switching interval i.e. the middle of current switching interval.

Sampling instant 650 is determined as the end of the second half switching interval which is also the beginning of the next switching interval.

Instant 654 is determined as the frontier between the first and second active vectors.

Sampling instants 651 and 652 are determined as in the middle of the durations of the applied vectors. These instants can be calculated relatively to the middle of switching cycle noted 653, using simple arithmetic as follows:

sampling instant 651=tMid+(tMax−tMid)/2;

sampling instant 652=tMin+(tMid−tMin)/2;

Alternatively, these sampling instants can be determined only once per switching period (at the beginning of switching period) when calculating sampling positions for the first half switching internal, in FIG. 6A, instants 611 and 612, considering the symmetry of the switching cycle with respect to the middle of the switching cycle.

The curve noted 675 represents the internal capacitor voltage (Vc). This voltage can be calculated by using DC-bus voltage capacitor measured at some particular sampling points noted 670, 671, 673 and 674.

The point noted 672 corresponds to a calculated internal capacitor voltage (Vc).

The curve noted 685 represents the current going through the DC-bus capacitor 150. This current is not measured but is instead calculated at points noted 680 and 681.

At step S36, the processor 200, for each half switching cycle, takes samples at the determined sampling instants of the voltage of the DC-bus capacitor 150 and values of the phase currents provided by the current sensors 135a to 135c.

It has to be noted here that only two current sensors 135 may be used in order to obtain the phase currents. The third one may be derived from the two current sensors values.

The curve noted 625 in FIG. 6A represents the internal DC-bus capacitor voltage (Vc). This voltage can be calculated by using DC-bus voltage capacitor measured at some particular sampling points noted 620, 621, 623 and 624. The point noted 622 corresponds to a calculated internal capacitor voltage (Vc).

The curve noted 635 in FIG. 6A represents the current going through the DC-bus capacitor 150. This current is not measured but is instead calculated at points noted 630 and 631.

The curve noted 675 in FIG. 6B represents the internal DC-bus capacitor voltage (Vc). This voltage can be calculated by using DC-bus voltage capacitor measured at some particular sampling points noted 670, 671, 673 and 674. The point noted 672 corresponds to a calculated internal capacitor voltage (Vc).

At step S36, the processor 200 takes, for each half switching sample, samples at the determined sampling instants of the voltage of the DC-bus capacitor 150 and values of the phase currents provided by the current sensors 135a to 135c.

It has to be noted here that only two current sensors 135 may be used in order to obtain the phase currents. The third one may be derived from the two current sensors values.

At step S37 the processor 200 determines the current Iavg1 noted 630 in FIG. 6A and 680 in FIG. 6B when the first active vector is applied and determines the current Iavg2 noted 631 in FIG. 6A and 681 in FIG. 6B when the second active vector is applied.

FIG. 7 represents an example of calculation of the DC-bus capacitor current during the active vectors depending on the sector in which the reference vector is located.

In FIG. 7, the calculation formula to determine Iavg1 and Iavg2 is determined depending on the position of reference vector within one of the six sectors denoted as 1 to 6. The sectors 1 to 6 correspond respectively to sectors noted 52a to 52f in FIG. 5.

Is1_C, Is2_C and Is3_C designate respectively the phase currents measured by sensors 135a, 135b and 135c sampled in middle of the first active vector, and Is1_D, Is2_D and Is3_D designate respectively the phase currents sampled in middle of the second active vector. For instance, if the reference vector is located in sector 1, referred as 52a in FIG. 5, then Iavg1=Is1_C and Iavg2=Is1_D+Is2_D.

At the same step S37, the processor 200 determines the voltage difference ΔVC1 noted 640 in FIG. 6A or 690 in FIG. 6B of the internal capacitor voltage between instants 615 and 614 in FIG. 6A or 654 and 655 in FIG. 6B, determines the voltage difference ΔVC2 noted 641 in FIG. 6A or 691 in FIG. 6B of the DC-bus capacitor voltage between instants 614 and 616 in FIG. 6A or 656 and 654 in FIG. 6B.

At the same step, the processor 200 obtains the temperature of the DC-bus capacitor.

At step S38, the processor 200 estimates the capacitance value of the DC-bus capacitor 150 according to the following formula:

$$Cest = \frac{I_{avg1} \cdot \Delta T1 + I_{avg2} \cdot \Delta T2}{Vc(n-1) - Vc(n)}$$

where the voltage Vc(n−1) is the voltage at point 620 in FIG. 6A or 674 in FIG. 6B and Vc(n) is the voltage at point 624 in FIG. 6A or 670 in FIG. 6B.

The capacitance value of the DC-bus capacitor 150 is for example determined at each half of each switching cycle.

At step S39, the processor 200 estimates the equivalent series resistor value of the DC-bus capacitor 150.

The equivalent series resistor value is determined during the first half switching cycle for the first active vector using the following formula:

$$ESR1 = \frac{\text{Vcap\_C} - Vc(n-1) + \frac{I_{avg1} \cdot \Delta T1}{2 \cdot Cest}}{I_{avg1}}$$

where Vcap_C is the capacitor voltage sampled at point 611 (FIG. 6A).

The equivalent series resistor value is determined during the first half switching cycle for the second active vector using the following formula:

$$ESR2 = \frac{\text{Vcap\_D} - Vc(n-1) + \frac{2 \cdot I_{avg1} \cdot \Delta T1 + I_{avg2} \cdot \Delta T2}{2 \cdot Cest}}{I_{avg2}}$$

where Vcap_D is the capacitor voltage sampled at point 612 (FIG. 6A).

The equivalent series resistor value is determined during the second half switching cycle for the first active vector using the following formula:

$$ESR1 = \frac{\text{Vcap\_C} - Vc(n-1) + \frac{2 \cdot I_{avg2} \cdot \Delta T2 + I_{avg1} \cdot \Delta T1}{2 \cdot Cest}}{I_{avg1}}$$

where Vcap_C is the capacitor voltage sampled at point 651 (FIG. 6B).

The equivalent series resistor value is determined during the second half switching cycle for the second active vector using the following formula:

$$ESR2 = \frac{\text{Vcap\_D} - Vc(n-1) + \frac{I_{avg2} \cdot \Delta T2}{2 \cdot Cest}}{I_{avg2}}$$

where Vcap_D is the capacitor voltage sampled at point 652 (FIG. 6B).

The estimation of the equivalent series resistor value can't be carried out everywhere, typically when an active vector is too short to allow correct sampling in its middle. This happens when the reference vector goes from one sector to another. Amongst different solutions, it is possible to simply consider ESR value of the widest active vector (either ESR1 or ESR2) and ignore the other, or alternatively to perform sampling in middle of the half switching interval to get a quite accurate estimation of ESR ($ESR_{mid}$):

$$ESR_{mid} = \frac{Vcap_{mid} - Vc_{mid}}{Ic_{mid}} = \frac{Vcap_{mid} - \frac{Vc(n-1) + Vc(n)}{2}}{Ic_{mid}}$$

where $Vcap_{mid}$ corresponds to the capacitor voltage sampled in the middle of the half switching interval, $Ic_{mid}$ corresponds to the average capacitor current calculated in the middle of the half switching interval that is quite equivalent to Iavg1 or Iavg2 depending on which active vector is the widest, $Vc_{mid}$ is the calculated internal capacitor voltage in middle of the half switching interval. $Vc_{mid}$ is an interpolation between two successive measures of Vc: Vc(n) and Vc(n−1).

ESR accuracy as well as C accuracy can be further enhanced by averaging successive results or performing some low pass filtering to remove the small residue of HF ripple (due to noise, quantification errors, imperfect sampling time . . . ). Despite the simplicity of this filtering scheme, the obtained estimation is thus even more accurate. Different filtering schemes can naturally be applied, facilitated by the fact that these parameters vary slowly and it is therefore easy to consider many successive estimations to determine them precisely.

At next step S40, the processor 200 checks if the DC-bus capacitor has reached the end of life. The end of life criterion is either the estimation of the ESR or the capacitance C of the DC-bus capacitor 150 to reach its ageing limit. Ageing limit is reached when either the estimation of ESR is upper than an end of life ESR value at the measured temperature T, or the estimated capacitance C is lower than an end of life capacitance value at the measured temperature T. If the ageing limit is reached, the processor 200 moves to step S41 where it activates the alarm to indicate that a maintenance if needed.

The end of life ESR or capacitance C is determined according to an initial self-calibration procedure which is performed following initial power up, or after a maintenance operation.

During a calibration period, for example selectable from a few hours to a few weeks, for each different stabilized operating temperature T, the processor 200 records an expected end of life ESR or capacitance C value of monitored parameter as function of an healthy measured value $ESR_{ini}(T)$ or $C_{ini}(T)$. The expected aged limit is calculated using ageing criterion: either fixed by the manufacturer (e.g. $ESR_{aged}(T)=2\times ESR_{ini}(T)$ or $C_{aged}(T)=0.8\times C_{ini}(T)$) or possibly a more accurate limit, based on pre-characterized data of same capacitor type to refine ageing criterion.

At the end of self-calibration period, a table of different end of life ESR or capacitance C values is available stored in non-volatile memory which covers the range of temperatures encountered during calibration, and that will allow future ageing tests. This procedure is performed during normal operation of the converter and does not create disturbances.

If the end of life criterion is true, the processor 200 commands the transfer at step S41 of an alarm signal that indicates that the DC-bus capacitor 150 has reached its end of life and that a maintenance procedure is required.

Naturally, many modifications can be made to the embodiments of the invention described above without departing from the scope of the present invention.

The invention claimed is:

1. Method for on-line monitoring a DC-bus capacitor comprised in a three-phase inverter having a diode rectifier front end, the three-phase inverter controlling the three-phase power provided to a load at each switching cycle using a space vector modulation, characterized in that the method comprises the steps of:
   determining, within the switching cycle, when current is not provided to the DC-bus capacitor,
   determining, for each switching cycle, the sector of a reference vector, active vectors durations and null voltage vectors durations,
   determining from the determined durations, sampling instants, sampling the currents through the three phases and the DC-bus voltage at the determined sampling instants, determining, from the phase currents sampled at the determined sampling instants, the current flowing through the DC-bus capacitor during the active vectors, estimating the capacitance value and/or the equivalent series resistance value of the DC-bus capacitor, comparing the capacitance value and/or the equivalent series resistance value to a threshold and determining if the DC-bus capacitor reaches its end of life according to the comparison result.

2. Method according to claim 1, characterized in that the method comprises steps of:

detecting current flowing from the diode rectifier to the DC bus capacitor, and determining the period when current is not provided to the DC-bus capacitor based on the detected current.

3. Method to claim 1, characterized in that the diode rectifier includes a plurality of diodes without including a switching element.

4. Method according to claim 1, characterized in that each switching cycle is divided into a first half switching cycle and a second half switching cycle and in that the sampling, the estimating and comparing steps are executed at each half switching cycle.

5. Method according to claim 4, characterized in that sampling instants are determined as in the middle of the durations of the active vectors or as the beginning of half switching cycles.

6. Method according to claim 1, characterized in that the period when current is not provided to the DC-bus capacitor is determined using a current sensor located at an output of the front end rectifier or by detecting a voltage drop of the DC-bus voltage.

7. Method according to claim 1, characterized in that the threshold is determined during a calibration period.

8. Method according to claim 7, characterized in that the threshold is selected among a plurality of thresholds using an obtained temperature of the DC-bus capacitor.

9. Device for on-line monitoring a DC-bus capacitor comprised in a three-phase inverter having a diode rectifier front end, the three-phase inverter controlling the three-phase power provided to a load at each switching cycle using a space vector modulation, characterized in that the device comprises:

means for determining, within the switching cycle, when current is not provided to the DC-bus capacitor, means for determining, for each switching cycle, the sector of a reference vector, active vectors durations and the null voltage vectors durations, means for determining from the determined durations, sampling instants, means for sampling the currents through the three phases and the DC-bus voltage at the determined sampling instants, means for determining, from the phase currents sampled at the determined sampling instants, the current flowing through the DC-bus capacitor during the active vectors, means for estimating the capacitance value and/or the equivalent series resistance value of the DC-bus capacitor, means for comparing the capacitance value and/or the equivalent series resistance value to a threshold and determining if the DC-bus capacitor reaches its end of life according to the comparison result.

10. Method for on-line monitoring a DC-bus capacitor comprised in a three-phase inverter having a diode rectifier front end, the three-phase inverter controlling the three-phase power provided to a load at each switching cycle using a space vector modulation, characterized in that the method comprises the steps of:

determining, within the switching cycle, when current is not provided to the DC-bus capacitor, determining, for each switching cycle, the sector of a reference vector, active vectors durations and null voltage vectors durations, determining from the determined durations, sampling instants, sampling the currents through the three phases and the DC-bus voltage at the determined sampling instants, determining, from the phase currents sampled at the determined sampling instants, the current flowing through the DC-bus capacitor during the active vectors, estimating the capacitance value and/or the equivalent series resistance value of the DC-bus capacitor, vectors according to the following formula:

where the voltage $Vc(n-1)$ is the voltage at the beginning of a half switching cycle, $$Cest = \frac{I_{avg1} \cdot \Delta T1 + I_{avg2} \cdot \Delta T2}{Vc(n-1) - Vc(n)}$$

$Vc(n)$ is the voltage at voltage at the end of the half switching cycle, Iavg1 and Iavg2 are determined depending on the position of reference vector within one of the sectors of the space vector modulation, $\Delta T1$ is the duration of a first active vector and $\Delta T2$ is the duration of a second active vector, comparing the capacitance value and/or the equivalent series resistance value to a threshold and determining if the DC-bus capacitor reaches its end of life according to the comparison result.

* * * * *